United States Patent
Yusuf

(10) Patent No.: US 12,294,354 B2
(45) Date of Patent: May 6, 2025

(54) RESONATOR-ASSISTED LC FILTER EXHIBITING HIGH-PASS AND BANDPASS BEHAVIOR

(71) Applicant: Qorvo US, Inc., Greensboro, NC (US)

(72) Inventor: Yazid Yusuf, Orlando, FL (US)

(73) Assignee: Qorvo US, Inc., Greensboro, NC (US)

( * ) Notice: Subject to any disclaimer, the term of this patent is extended or adjusted under 35 U.S.C. 154(b) by 169 days.

(21) Appl. No.: 18/083,285

(22) Filed: Dec. 16, 2022

(65) Prior Publication Data
US 2023/0198504 A1 Jun. 22, 2023

Related U.S. Application Data

(60) Provisional application No. 63/290,985, filed on Dec. 17, 2021.

(51) Int. Cl.
| | |
|---|---|
| H03H 9/64 | (2006.01) |
| H03H 3/08 | (2006.01) |
| H03H 7/01 | (2006.01) |
| H03H 9/00 | (2006.01) |

(52) U.S. Cl.
CPC ............ *H03H 9/6489* (2013.01); *H03H 3/08* (2013.01); *H03H 7/0115* (2013.01); *H03H 7/1766* (2013.01); *H03H 7/1791* (2013.01); *H03H 9/009* (2013.01)

(58) Field of Classification Search
CPC ..... H03H 7/0115; H03H 9/009; H03H 9/6489
USPC ................................. 333/175, 186, 190–193
See application file for complete search history.

(56) References Cited

U.S. PATENT DOCUMENTS

2020/0028493 A1* 1/2020 Ta .................... H03H 7/0138

OTHER PUBLICATIONS

Mason, W.P., "Electromechanical Transducers and Wave Filters," D. Van Nostrand Company, Inc., 1942, 350 pages.
Mason, W.P., "Electrical Wave Filters Employing Crystals with Normal and Divided Electrodes," The Bell System Technical Journal, vol. 19, Issue 2, Apr. 1940, Nokia Bell Labs, pp. 221-248.
Mason, W.P. et al., "Resistance Compensated Band-Pass Crystal Filters for Use in Unbalances Circuits," The Bell System Technical Journal, vol. 16, No. 4, Oct. 1937, 14 pages.

* cited by examiner

*Primary Examiner* — Rakesh B Patel
(74) *Attorney, Agent, or Firm* — Withrow & Terranova, P.L.L.C.

(57) ABSTRACT

A filter circuit includes a first inductor circuit connected in series with a second inductor circuit, and a first capacitor circuit connected in series with a second capacitor circuit. The first inductor circuit and the second inductor circuit are connected between a first input/output port and a second input/output port of the filter circuit. A third inductor circuit is connected between a reference node and a first node that is between the first inductor circuit and the second inductor circuit. A resonator circuit is connected to a second node between the first capacitor circuit and the second capacitor circuit. A fourth inductor circuit is connected between the resonator circuit and the reference node. In some embodiments, another resonator circuit is connected between the input port and the output port of the filter circuit.

20 Claims, 9 Drawing Sheets

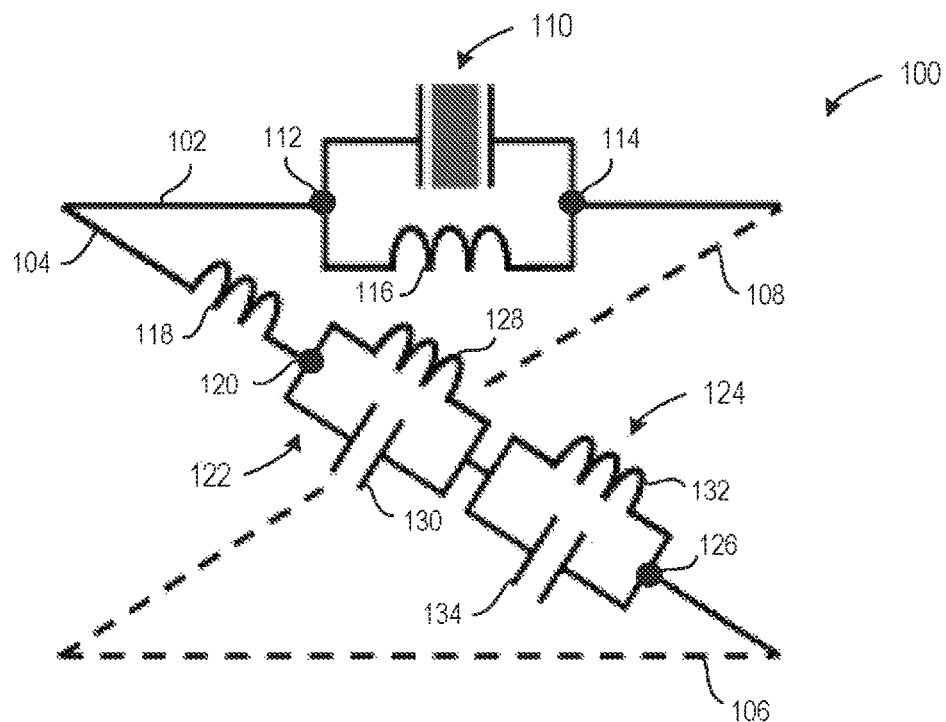
FIG. 1A – Related Art
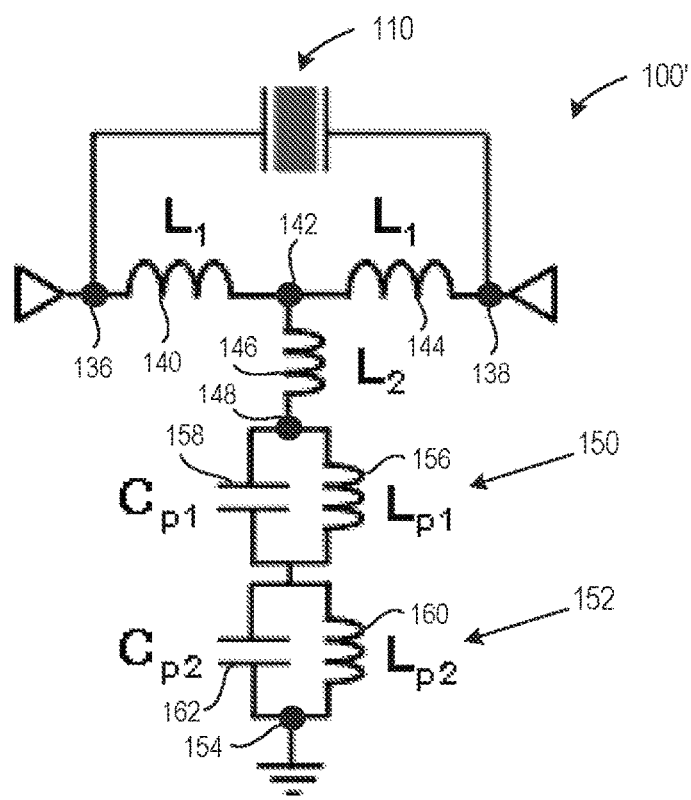
FIG. 1B – Related Art

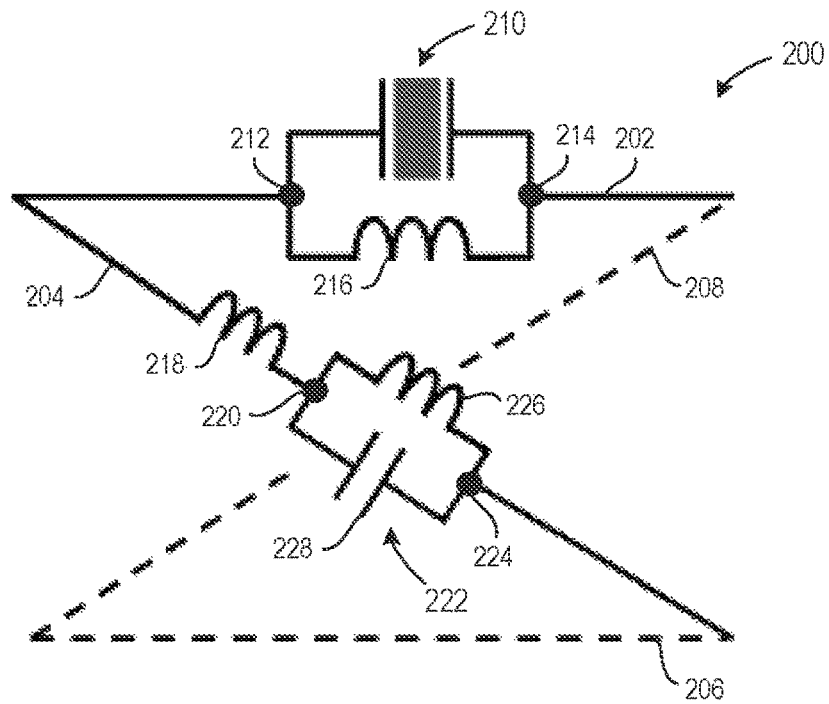
FIG. 2A – Related Art
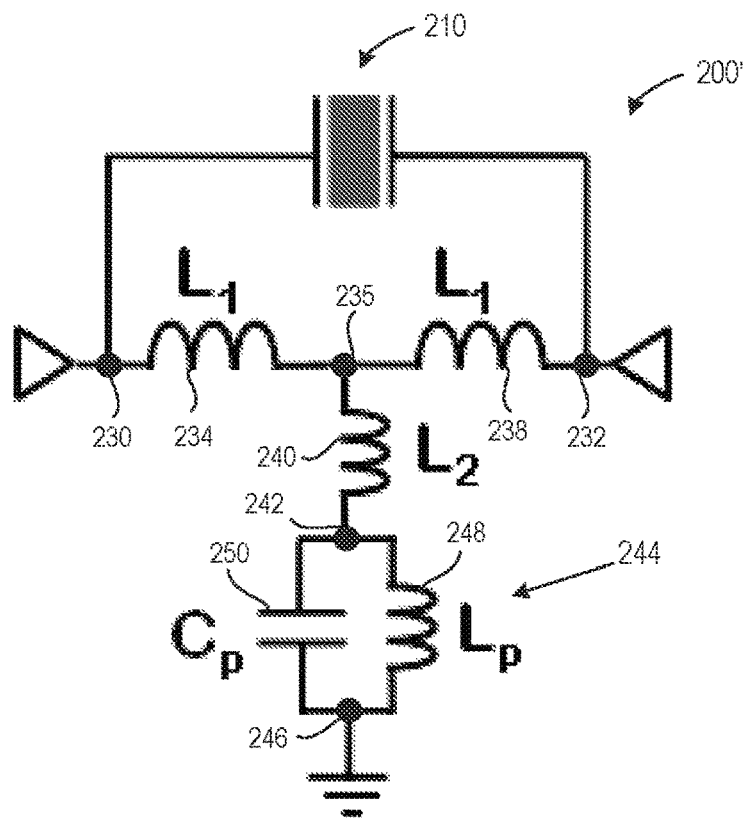
FIG. 2B – Related Art

RESONATOR-ASSISTED LC FILTER EXHIBITING HIGH-PASS AND BANDPASS BEHAVIOR

RELATED APPLICATIONS

This application claims the benefit of provisional patent application Ser. No. 63/290,985, filed Dec. 17, 2021, the disclosure of which is hereby incorporated herein by reference in its entirety.

FIELD OF THE DISCLOSURE

The present disclosure relates to inductor-capacitor (LC) filters, and more particularly to resonator-assisted LC filters, such as bulk acoustic wave (BAW)-assisted LC filters.

BACKGROUND

With the proliferation of fifth generation (5G) communication systems, there is increasing need for high-performance wideband filters. High frequency 5G bands generally have larger fractional bandwidths with some bands spanning over thirty percent (30%). Such bandwidths are difficult to realize using conventional ladder networks based on acoustic resonators since the bandwidth is inherently limited by the electromechanical coupling (k2E).

One alternative is to use inductor-capacitor (LC) filter circuits, which are not limited in bandwidth. However, in some instances, the LC filter circuits may suffer from low quality factors.

SUMMARY

It is beneficial to augment LC filter circuits with high quality factor acoustic resonators to enhance frequency selectivity and improve filter insertion loss. These filters have become known as resonator-assisted LC filter circuits. The present disclosure relates to resonator-assisted LC filter circuits that exhibit highpass behavior. In certain embodiments, the resonator is a BAW resonator or a surface acoustic wave (SAW) resonator. The resonator-assisted LC filter circuits according to the present disclosure have reduced overall inductance, which allows for implementation in smaller form factors. Through some modification, the filter can be made into a bandpass filter with steep rejections at the lower band edge and at the upper band edge.

In one aspect, a filter circuit includes a first inductor circuit connected in series with a second inductor circuit, and a first capacitor circuit connected in series with a second capacitor circuit. The first inductor circuit and the second inductor circuit are connected between a first input/output port and a second input/output port of the filter circuit. A third inductor circuit is connected between a reference node and a first node that is between the first inductor circuit and the second inductor circuit. A resonator circuit is connected to a second node between the first capacitor circuit and the second capacitor circuit. A fourth inductor circuit is connected between the resonator circuit and the reference node. The filter circuit exhibits highpass filter behavior at frequencies above a given frequency. In some embodiments, another resonator circuit is connected between the input port and the output port of the filter circuit, and the resonator-assisted LC filter circuit exhibits bandpass behavior.

In another aspect, a system includes radio-frequency (RF) input circuitry, RF output circuitry, and filter circuitry connected between the RF input circuitry and the RF output circuitry. The filter circuitry comprises one or more filter circuits. At least one filter circuit includes a first inductor circuit connected in series with a second inductor circuit, and a first capacitor circuit connected in series with a second capacitor circuit. The first inductor circuit and the second inductor circuit are connected between a first input/output port and a second input/output port of the filter circuit. A third inductor circuit is connected between a reference node and a first node that is between the first inductor circuit and the second inductor circuit. A resonator circuit is connected to a second node between the first capacitor circuit and the second capacitor circuit. A fourth inductor circuit is connected between the resonator circuit and the reference node. The filter circuit exhibits highpass filter behavior at frequencies above a given frequency. In some embodiments, another resonator circuit is connected between the input port and the output port of the filter circuit, and the resonator-assisted LC filter circuit exhibits bandpass behavior.

In yet another aspect, a method of providing a filter circuit includes providing a first inductor circuit connected in series with a second inductor circuit, where the first inductor circuit and the second inductor circuit are connected between an input port and an output port of the filter circuit. A first capacitor circuit that is connected in series with a second capacitor circuit is provided, where the first capacitor circuit and the second capacitor circuit are connected between the input port and the output port of the filter circuit. A third inductor circuit that is connected between a reference node and a first node between the first inductor circuit and the second inductor circuit is provided. A resonator circuit that is connected to a second node between the first capacitor circuit and the second capacitor circuit is provided. A fourth inductor circuit that is connected between the resonator circuit and the reference node is provided.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 1A illustrates an implementation of a related-art first lattice filter;

FIG. 1B illustrates an implementation of a related-art first bridge T filter of the first lattice filter shown in FIG. 1A;

FIG. 2A illustrates an implementation of a related-art second lattice filter;

FIG. 2B illustrates an implementation of a related-art second bridge T filter of the second lattice filter shown in FIG. 2A;

DETAILED DESCRIPTION

Figure 3A:
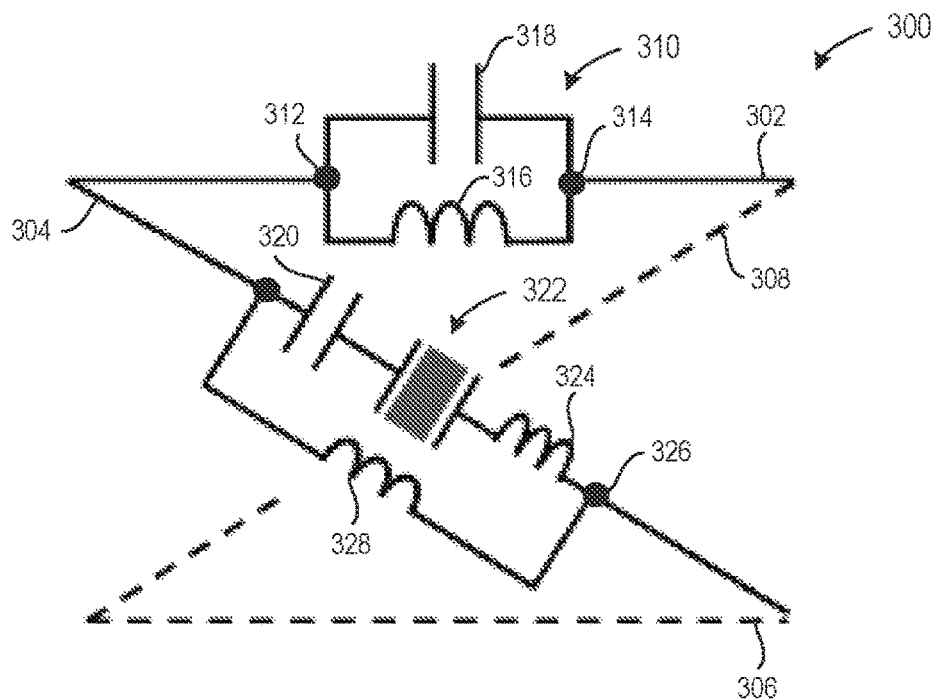
FIG. 3A illustrates an implementation of a third lattice filter in accordance with embodiments of the disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

FIG. 1A illustrates an implementation of a related-art first lattice filter 100. The first lattice filter 100 includes a first electrical path 102, a second electrical path 104, a third electrical path 106, and a fourth electrical path 108. The first electrical path 102 includes a resonator circuit 110 connected between a node 112 and a node 114, and an inductor circuit 116 connected between the node 112 and the node 114. As such, the resonator circuit 110 and the inductor circuit 116 are connected in parallel.

The second electrical path 104 includes an inductor circuit 118 connected between the node 112 and a node 120. A first inductor-capacitor (LC) circuit 122 and a second LC circuit 124 are connected in series between the node 120 and a node 126. The first LC circuit 122 includes an inductor circuit 128 and a capacitor circuit 130 connected in parallel. The second LC circuit 124 includes an inductor circuit 132 and a capacitor circuit 134 connected in parallel.

The third electrical path 106 is shown as a dashed line for simplicity and an uncrowded view of the first lattice filter 100. However, the third electrical path 106 includes the same components as the first electrical path 102. As such, the third electrical path 106 includes the resonator circuit 110 and the inductor circuit 116 connected in parallel.

The fourth electrical path 108 is also shown as a dashed line for simplicity and an uncrowded view of the first lattice filter 100. However, the fourth electrical path 108 includes the same components as the second electrical path 104. As such, the fourth electrical path 108 includes the inductor circuit 118 connected in series with the first LC circuit 122, and the second LC circuit 124 connected in series with the first LC circuit 122.

In the 1930s and 1940s, there was a focused effort to design crystal-based filters, mainly quartz. Design and synthesis of filters based on lattice configuration was a commonly used approach. While the lattice configuration is helpful in design stages, it is not a very practical configuration to implement since it is a balanced structure that also requires duplicate components. It is generally more desirable to have filters in unbalanced form. A method by which some lattice filters could be converted to a bridge T topology was developed.

FIG. 1B illustrates an implementation of a related-art first bridge T filter 100' of the first lattice filter 100 shown in FIG. 1A. The first bridge T filter 100' includes the resonator circuit 110 connected between a node 136 and a node 138. An inductor circuit 140 is connected between the node 136 and a node 142, where the node 142 is between the node 136 and the node 138. An inductor circuit 144 is connected between the node 142 and the node 138. An inductor circuit 146 is connected between the node 142 and a node 148. A first LC circuit 150 and a second LC circuit 152 are connected in series between the node 148 and a reference node 154 (e.g., ground). The first LC circuit 150 includes an inductor circuit 156 and a capacitor circuit 158 connected in parallel. The second LC circuit 152 includes an inductor circuit 160 and a capacitor circuit 162 connected in parallel.

FIG. 2A illustrates an implementation of a related-art second lattice filter 200. The second lattice filter 200 includes a first electrical path 202, a second electrical path 204, a third electrical path 206, and a fourth electrical path 208. The first electrical path 202 includes a resonator circuit 210 connected between a node 212 and a node 214, and an inductor circuit 216 connected between the node 212 and the node 214. As such, the resonator circuit 210 and the inductor circuit 216 are connected in parallel.

The second electrical path 204 includes an inductor circuit 218 connected between the node 212 and a node 220. An LC circuit 222 is connected between the node 220 and a node 224. The LC circuit 122 includes an inductor circuit 226 and a capacitor circuit 228 connected in parallel.

The third electrical path 206 is shown as a dashed line for simplicity and an uncrowded view of the second lattice filter 200. However, the third electrical path 206 includes the same components as the first electrical path 202. As such, the third electrical path 206 includes the resonator circuit 210 and the inductor circuit 216 connected in parallel.

The fourth electrical path 208 is also shown as a dashed line for simplicity and an uncrowded view of the second lattice filter 200. However, the fourth electrical path 208 includes the same components as the second electrical path 204. As such, the fourth electrical path 208 includes the inductor circuit 218 connected in series with the LC circuit 222.

FIG. 2B illustrates an implementation of a related-art second bridge T filter 200' of the second lattice filter 200 shown in FIG. 2A. The second bridge T filter 200' includes the resonator circuit 210 connected between a node 230 and a node 232. An inductor circuit 234 is connected between the node 230 and a node 235, where the node 235 is between the node 230 and the node 232. An inductor circuit 238 is connected between the node 235 and the node 232. An inductor circuit 240 is connected between the node 235 and a node 242. An LC circuit 244 is connected between the node 242 and a reference node 246 (e.g., ground). The LC circuit 244 includes an inductor circuit 248 and a capacitor circuit 250 connected in parallel.

In a non-limiting nonexclusive example, the inductor circuit 234 and the inductor circuit 238 each has an inductance value of two and one-half (2.5) nanohenries (nH), the inductor circuit 240 has an inductance value of zero (0) nH, the inductor circuit 248 has an inductance value of one and two tenths (1.2) nH, and the capacitor circuit 250 has a capacitance value of one and eight tenths (1.8) picofarads (pF).

Although the first bridge T filter 100' and the second bridge T filter 200' provide good performance, the inductance values in the first bridge T filter 100' and the second bridge T filter 200' are typically large. In some instances, the larger inductance values prohibit the implementation of the first bridge T filter 100' and the second bridge T filter 200' in a small form factor, especially if multiple filter circuits are to be cascaded to meet desired rejection requirements.

Figure 3B:
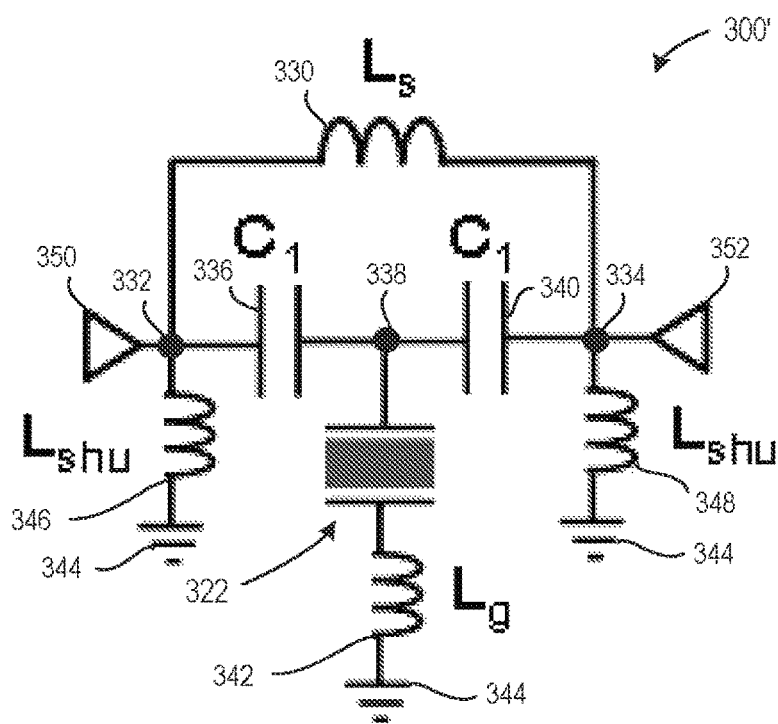
FIG. 3B illustrates an implementation of a third bridge T filter of the third lattice filter shown in FIG. 3A in accordance with embodiments of the disclosure.

Embodiments disclosed herein provide a filter circuit that exhibits high-pass behavior. FIG. 3A and FIG. 3B show the filter lattice representation and its bridge T implementation, respectively. In certain embodiments, the values of inductance needed in the filter shown in FIG. 3B can be comparable to the inductance values of the filter in FIG. 2B. However, using a delta-Y transformation, it is possible to transform the inductors in FIG. 3B into a Y configuration, resulting in the equivalent filter circuit shown in FIG. 3C. This equivalent filter configuration is also referred to as twin-T.

FIG. 3A illustrates an implementation of a third lattice filter in accordance with embodiments of the disclosure. The third lattice filter 300 includes a first electrical path 302, a second electrical path 304, a third electrical path 306, and a fourth electrical path 308. The first electrical path 302 includes an LC circuit 310 connected between a node 312 and a node 314. The LC circuit 310 includes an inductor circuit 316 and a capacitor circuit 318 connected in parallel.

The second electrical path 304 includes a capacitor circuit 320, a resonator circuit 322, and an inductor circuit 324 connected in series between the node 312 and a node 326. An inductor circuit 328 is connected between the node 312 and the node 326 and in parallel with the capacitor circuit 320, the resonator circuit 322, and the inductor circuit 324.

The third electrical path 306 is shown as a dashed line for simplicity and an uncrowded view of the third lattice filter 300. However, the third electrical path 306 includes the same components as the first electrical path 302. As such, the third electrical path 306 includes the LC circuit 310.

The fourth electrical path 308 is also shown as a dashed line for simplicity and an uncrowded view of the third lattice filter 300. However, the fourth electrical path 308 includes the same components as the second electrical path 304. As such, the fourth electrical path 308 includes the capacitor circuit 320, the resonator circuit 322, and the inductor circuit 324 connected in series and the inductor circuit 328 connected in parallel with the capacitor circuit 320, the resonator circuit 322, and the inductor circuit 324.

FIG. 3B illustrates an implementation of a third bridge T filter 300' of the third lattice filter 300 shown in FIG. 3A in accordance with embodiments of the disclosure. The third bridge T filter 300' includes an inductor circuit 330 connected between a node 332 and a node 334. A capacitor circuit 336 is connected between the node 332 and a node 338, where the node 338 is between the node 332 and the node 334. A capacitor circuit 340 is connected between the node 338 and the node 334. The resonator circuit 322 and an inductor circuit 342 are connected in series between the node 338 and a reference node 344 (e.g., ground). An inductor circuit 346 is connected in shunt between the node 332 and the reference node 344. An inductor circuit 348 is connected in shunt between the node 334 and the reference node 344. An input/output port 350 is connected to the node 332 and an input/output port 352 is connected to the node 334.

Figure 3C:
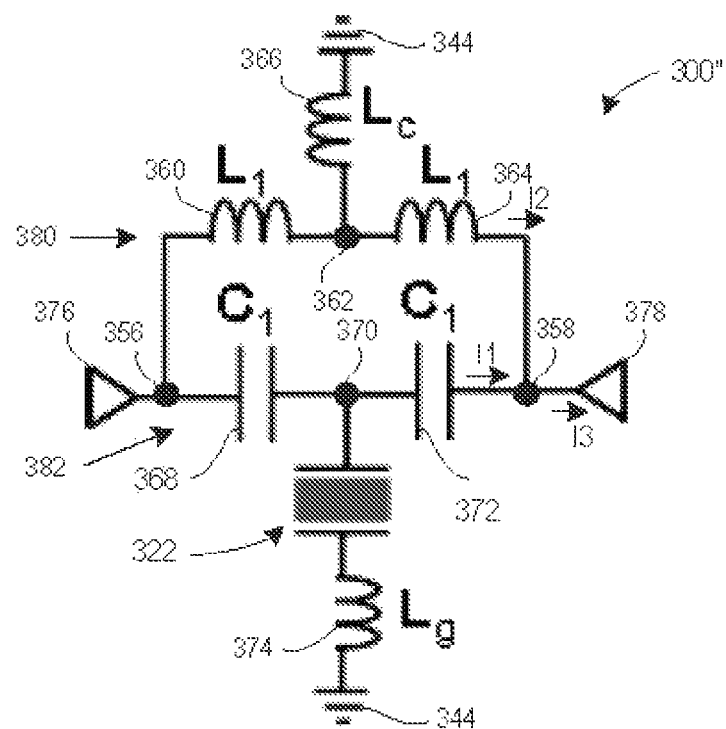
FIG. 3C illustrates an implementation of an equivalent filter associated with the third bridge T filter shown in FIG. 3B in accordance with embodiments of the disclosure.

FIG. 3C illustrates an implementation of an equivalent filter 300" associated with the third bridge T filter 300' shown in FIG. 3B in accordance with embodiments of the disclosure. The equivalent filter 300" includes an inductor circuit 360 connected between a node 356 and a node 362, and an inductor circuit 364 connected between the node 362 and the node 358. An input port 376 is connected to the node 356, and an output port 378 is connected to the node 358. Thus, the inductor circuit 360 and the inductor circuit 364 are connected in series between the input port 376 and the output port 378. The node 362 is between the inductor circuit 360 and the inductor circuit 364. An inductor circuit 366 is connected in shunt between the node 362 and the reference node 344.

A capacitor circuit 368 is connected between the node 356 and a node 370. A capacitor circuit 372 is connected between the node 370 and the node 358. Thus, the capacitor circuit 368 and the capacitor circuit 372 are connected in series between the input port 376 and the output port 378 and in parallel to the inductor circuit 360 and the inductor circuit 364. The node 370 is between the capacitor circuit 368 and the capacitor circuit 372.

The resonator circuit 322 and an inductor circuit 374 are connected in series between the node 370 and the reference node 344. In particular, the resonator circuit 322 is connected to the node 370 and the inductor circuit 374 is connected between the resonator circuit 322 and the reference node 344. In some embodiments, the resonator circuit 322 is a bulk acoustic wave (BAW) resonator. In other embodiments, the resonator circuit 322 is a surface acoustic wave (SAW) resonator.

In a non-limiting nonexclusive example, the inductor circuit 360 and the inductor circuit 364 each has an inductance value of one-half (0.5) nH, the inductor circuit 366 has an inductance value of four tenths (0.4) nH, the inductor circuit 374 has an inductance value of zero (0) nH, and the capacitor circuit 368 and the capacitor circuit 372 each has a capacitance value of two and two tenths (2.2) picofarads (pF). The equivalent filter 300" uses less overall inductance with a total of one and four tenths (1.4) nH compared with six and two tenths (6.2) nH in the example second T bridge filter 200' shown in FIG. 2B. The overall inductance of the equivalent filter 300" is approximately four (4) times less inductance compared to the overall inductance of the second T bridge filter 200' shown in FIG. 2B. The reduced overall inductance of the equivalent filter 300" enables the equivalent filter 300" to be used in devices and designs that have smaller footprints.

The operation of the equivalent filter 300" is briefly described. First, the equivalent filter 300" includes a first electrical path 380 (e.g., through the inductor circuit 360 and the inductor circuit 364) and a second electrical path 382 (e.g., through the capacitor circuit 368 and the capacitor circuit 372) connected between the input port 376 and the output port 378. The equivalent filter 300" relies on interference between signals through the first electrical path 380 and the second electrical path 382 to realize the characteristics of the equivalent filter 300".

Figure 4:
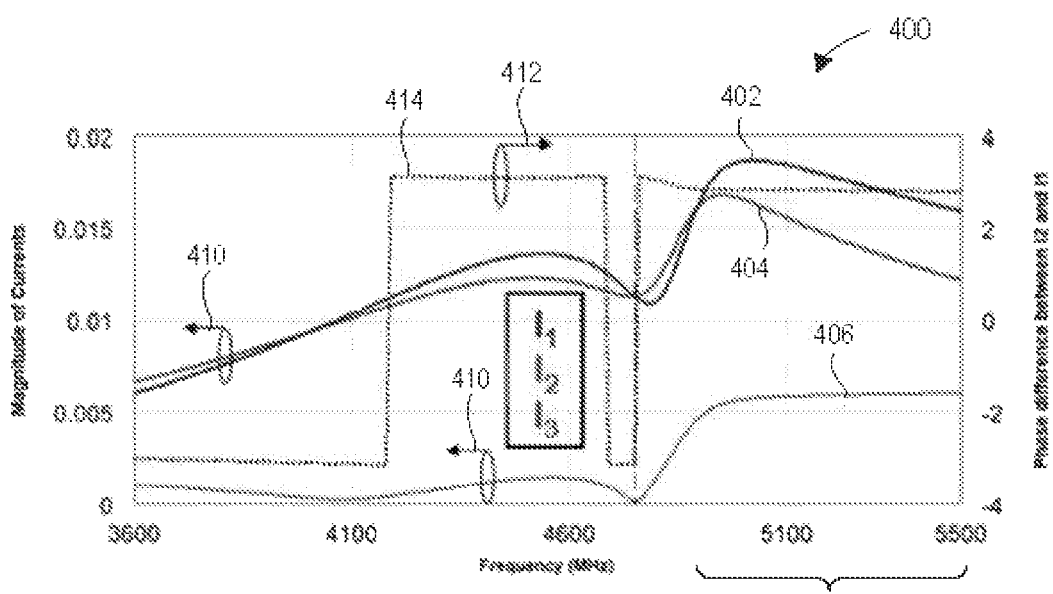
FIG. 4 illustrates an example graph of a current I1, a current I2, and a current I3 in the equivalent filter shown in FIG. 3C in accordance with embodiments of the disclosure.

The operation of the equivalent filter 300" is shown in more detail in the graph 400 of FIG. 4, where the left vertical axis represents magnitude of currents in amps (A), the right vertical axis represents a phase difference between the current I2 and the current I1 (in radians), the horizonal axis represents frequency in megahertz (MHz), the arrows 410 identify the left vertical axis as the vertical axis that applies to the plot 402, the plot 404, and the plot 406, and the arrow 412 identifies the right vertical axis as the vertical axis that applies to the plot 414. The magnitude of the current I1 in the first electrical path 380 is shown in plot 402, the magnitude of the current I2 in the second electrical path 382 is depicted in plot 404, and the magnitude of the current I3 into the output port 378 is shown in plot 406. The current I3 into the output port is the sum of the first current I1 and the second current I2. The plot 414 represents a phase difference between the second current I2 and the first current I1.

In the passband region 408 (e.g., the frequencies starting around five thousand (5000) MHz), the first current I1 and the second current I2 add up more constructively to create the passband region 408. The equivalent filter 300" exhibits a stopband between direct current (DC) frequency and up to approximately four thousand seven hundred and fifty (4,750) MHz, where the currents I1 and I2 add up more destructively resulting in smaller total output current I3. As shown in FIG. 4, two frequency points are particularly interesting, namely, the frequency of four thousand eighty (4,080) MHz and the frequency of four thousand seven hundred and forty-eight (4,748) MHz. At the two interesting frequency points, the first current I1 and the second current I2 have equal magnitude and a one hundred and eighty (180)-degree phase difference, which results in perfect destructive interference and therefore the highest rejection is expected at these frequencies.

Figure 5:
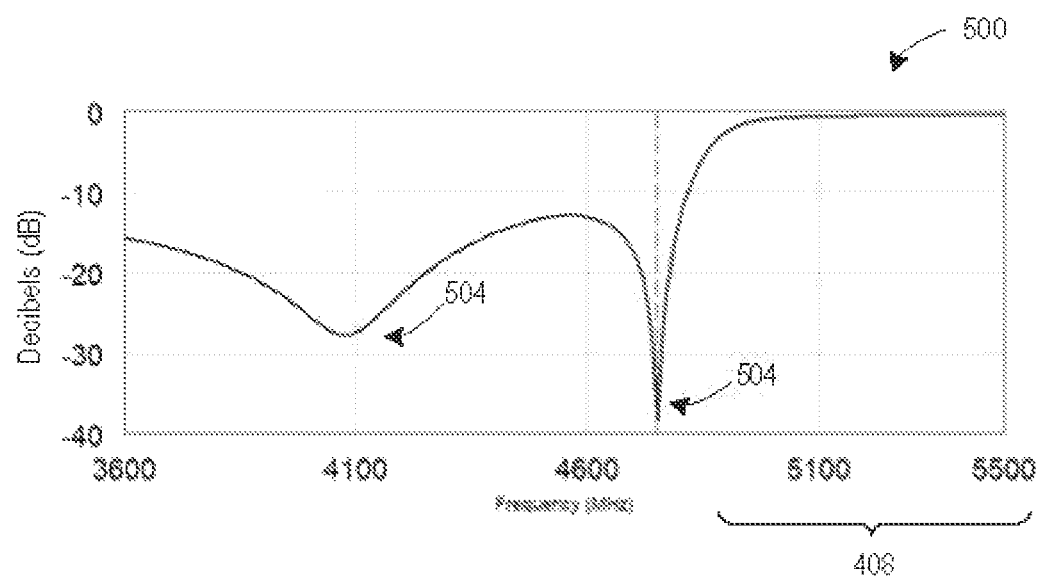
FIG. 5 illustrates an example graph that shows the rejection of the equivalent filter shown in FIG. 3C in accordance with embodiments of the disclosure.

FIG. 5 illustrates an example graph 500 that shows the rejection of the equivalent filter 300" in accordance with embodiments of the disclosure. The destructive interference between the first current I1 and the second current I2 is responsible for the deep notch 504 in rejection. Another notch 506 is observed at approximately four thousand eighty (4080) MHz. Additionally, the plot 406 (the plot of the current I3 in FIG. 4) closely resembles the filter rejection shown in FIG. 5.

Figure 6:
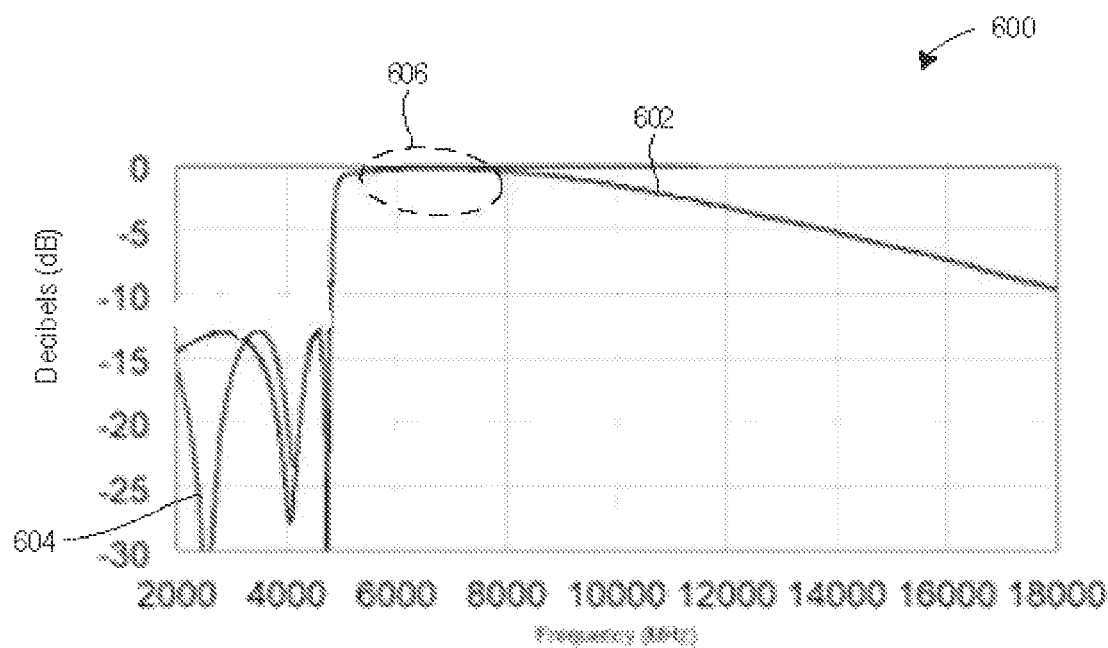
FIG. 6 illustrates a graph of an example plot of a performance of the equivalent filter shown in FIG. 3C and a plot of a performance of the related-art bridge T filter shown in FIG. 2B in accordance with embodiments of the disclosure.

FIG. 6 illustrates an example graph 600 of an example plot 602 that depicts a performance of the equivalent filter 300" shown in FIG. 3C and an example plot 604 that depicts a performance of the second bridge T filter 200' shown in FIG. 2B in accordance with embodiments of the disclosure. The vertical axis represents dB and the horizontal axis represents frequency in MHz.

The plot 602 and the plot 604 enable a comparison of the performance of the equivalent filter 300" and the second bridge T filter 200'. The equivalent filter 300" has an insertion loss that is similar to the insertion loss of the second bridge T filter 200'. For example, at the frequencies of approximately three thousand (3000) MHz, four thousand five hundred (4500) MHz, and six thousand (6000) MHz, the plot 602 generally corresponds to the plot 604. Additionally, the equivalent filter 300" has a steep rejection at the lower band edge.

While the plot 602 of the equivalent filter 300" shows high-pass behavior, the insertion loss of the equivalent filter 300" typically increases gradually, which provides some rejection at higher frequencies. In some instances, the rejection at higher frequencies may be useful in applications where a filter may be used in conjunction with other lowpass and/or bandpass filters to form a bandpass filter. A slope of the plot 602 may be changed by adjusting one or more inductance values and/or capacitance values in the equivalent filter 300".

Figure 7:
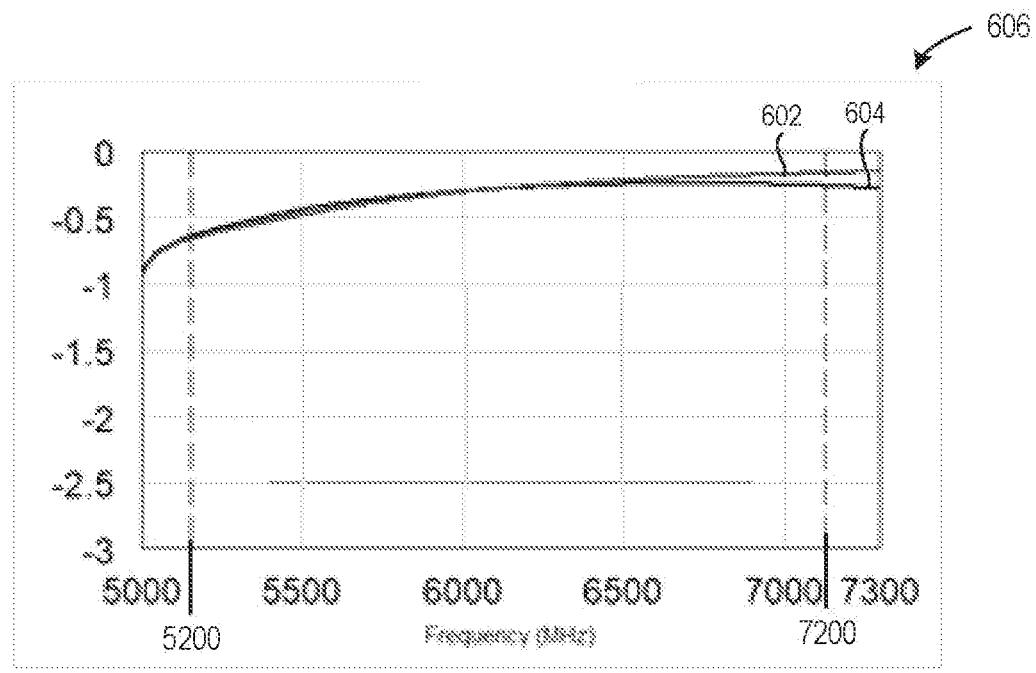
FIG. 7 illustrates an enlarged view of the passband region shown in FIG. 6 in accordance with embodiments of the disclosure.

FIG. 7 illustrates an enlarged view of the passband region 606 shown in FIG. 6 in accordance with embodiments of the disclosure. In the example exploded view 700, the passband region ranges between approximately five thousand two hundred (5200) MHz to seven thousand two hundred (7200) MHz. As noted earlier, the insertion loss of the equivalent filter 300" (plot 602) typically increases gradually, which provides some rejection at higher frequencies. In FIG. 7, the rejections range from approximately minus six tenths (−0.6) dB at five thousand two hundred (5200) MHz to approximately minus three tenths (−0.3) dB at seven thousand two hundred (7200) MHz. In other embodiments, the equivalent filter 300" can be designed to have different rejections in the passband region 606. For example, the equivalent filter 300" may be designed to have flatter rejections in the passband region 606.

Figure 8:
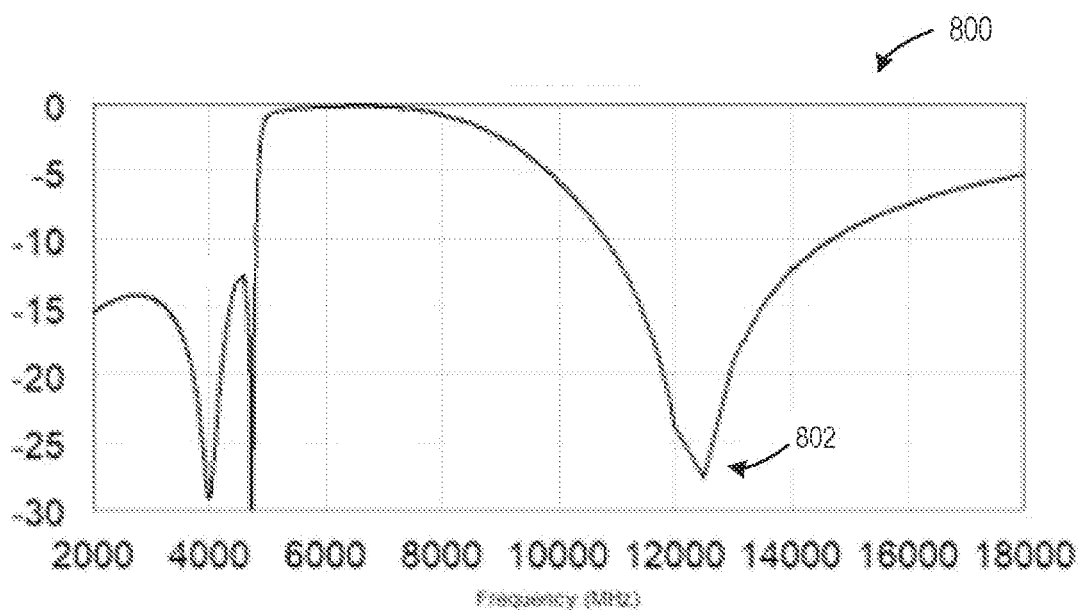
FIG. 8 illustrates an example graph of a performance of the equivalent filter shown in FIG. 3C with a different inductance value.

FIG. 8 illustrates an example graph 800 of a performance of the equivalent filter 300" shown in FIG. 3C with a different inductance value in the equivalent filter 300". In some embodiments, the equivalent filter 300" shown in FIG. 3C may be modified to have more bandpass-like behavior by increasing the inductance value of the inductor circuit 374 to a different value (e.g., a higher value). In FIG. 8, the inductance value of the inductor circuit 374 is increased to three tenths (0.3) nH. This increase in the inductance value of the inductor circuit 374 improves the rejection at around twelve thousand (12000) MHz by producing the notch 802 in rejection. Thus, the rejection of the equivalent filter 300" can be customized for the rejections needed in different systems.

Figure 9:
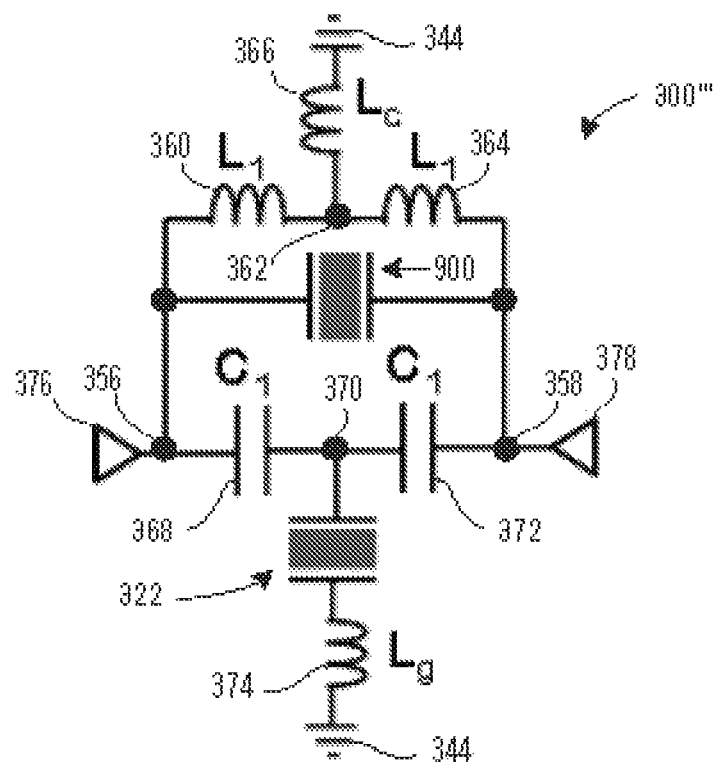
FIG. 9 illustrates the equivalent filter shown in FIG. 3C with an additional acoustic resonator in accordance with embodiments of the disclosure.

FIG. 9 illustrates a modified equivalent filter 300''' associated with the equivalent filter 300" shown in FIG. 3C with an additional resonator circuit 900 in accordance with embodiments of the disclosure. The resonator circuit 900 is connected between the node 356 (e.g., the input port 376) and the node 358 (e.g., the output port 378) and in parallel with the inductor circuit 360 and the inductor circuit 364. The resonator circuit 900 is also connected in parallel with the capacitor circuit 368 and the capacitor circuit 372.

As will be described in more detail in conjunction with FIG. 10, the modified equivalent filter 300''' exhibits bandpass behavior based on the addition of the resonator circuit 900. In a non-limiting nonexclusive example, the inductor circuit 360 and the inductor circuit 364 each has an inductance value of approximately five tenths and one hundredth (0.51) nH, the inductor circuit 366 has an inductance value of two tenths (0.2) nH, the inductor circuit 374 has an inductance value of two tenths (0.2) nH, and the capacitor circuit 368 and the capacitor circuit 372 each has a capacitance value of one and eight tenths and five hundredths (0.85) pF. In other embodiments, one or more inductance values and/or capacitance values may differ from these example values.

Figure 10:
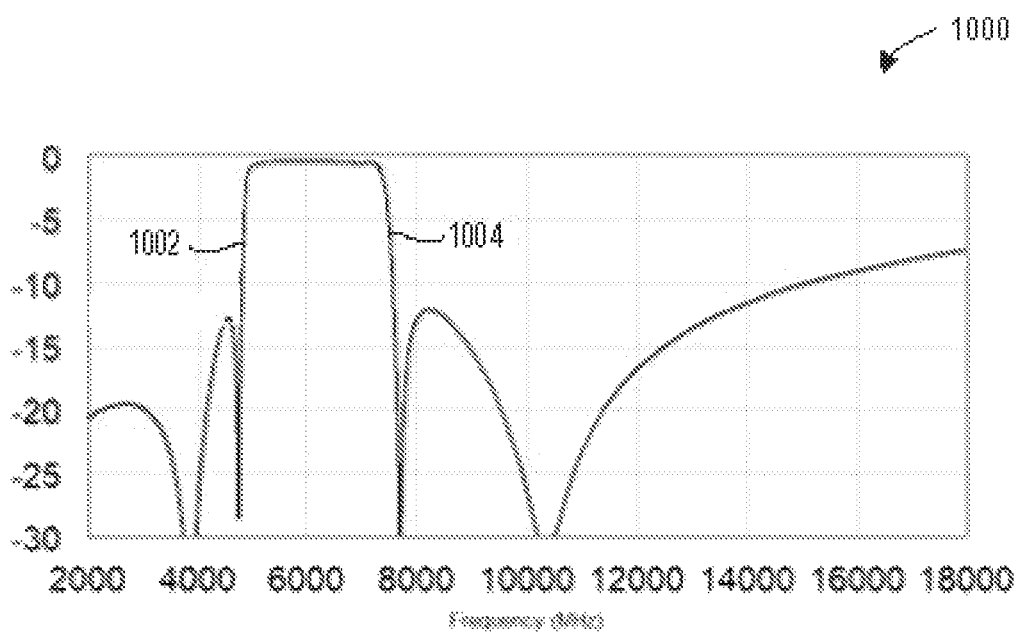
FIG. 10 illustrates a plot showing the filter response of the modified equivalent filter shown in FIG. 9.

FIG. 10 illustrates an example plot 1000 showing a filter response of the modified equivalent filter 300''' shown in FIG. 9. The vertical axis represents dB and the horizontal axis represents frequency in MHz. As shown in FIG. 10, the modified equivalent filter 300''' is made to exhibit bandpass behavior with a first sharp transition 1002 at the lower band edge of approximately five thousand (5000) MHz, and a second sharp transition 1004 at the upper band edge of approximately seven thousand three hundred (7300) MHz.

Figure 11:
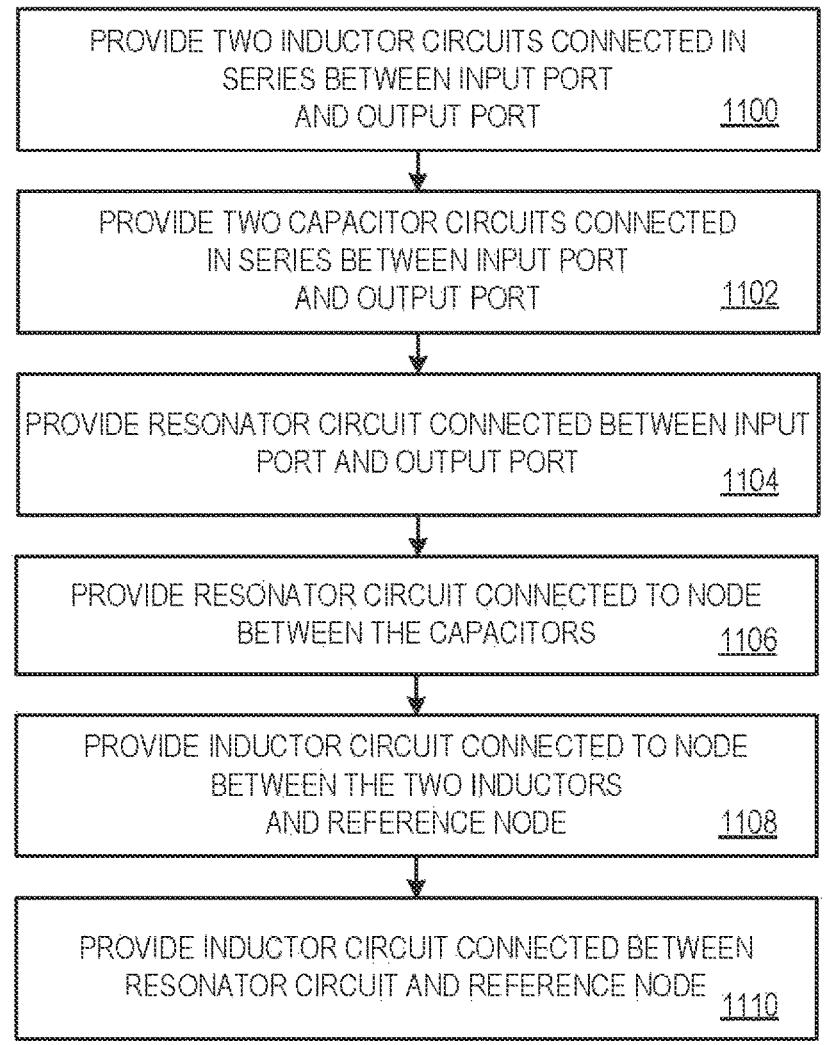
FIG. 11 illustrates a flowchart of a method of providing a resonator-assisted LC filter circuit.

FIG. 11 illustrates a flowchart of a method of providing a resonator-assisted LC circuit. As discussed earlier, the resonator may be a BAW resonator or an SAW resonator. Initially, as shown in block 1100, two inductor circuits that are connected in series are provided. The two inductor circuits are connected between the input port and the output port of the resonator-assisted LC circuit.

Two capacitor circuits that are connected in series are provided at block 1102. The two capacitor circuits are connected between the input port and the output port of the resonator-assisted LC circuit. Next, as shown in optional block 1104, a resonator circuit may be provided, where the resonator circuit is connected between the input port and the output port. For example, as shown in FIG. 9, the resonator circuit 900 is connected between the input port 376 and the output port 378 and in parallel with the two inductor circuits 360, 364 and in parallel with the two capacitor circuits 368, 372.

A resonator circuit is provided at block 1106. The resonator circuit is connected to a node between the two capacitor circuits (e.g., node 370 in FIGS. 3 and 9). Another inductor circuit is provided at block 1108. The inductor circuit is connected between a node that is between the two inductor circuits (e.g., node 362 in FIGS. 3 and 9) and the reference node (e.g., ground). A resonator circuit is provided at block 1108. Another inductor circuit is provided at block 1110. The inductor circuit is connected between the resonator circuit and the reference node (e.g., ground).

Figure 12:
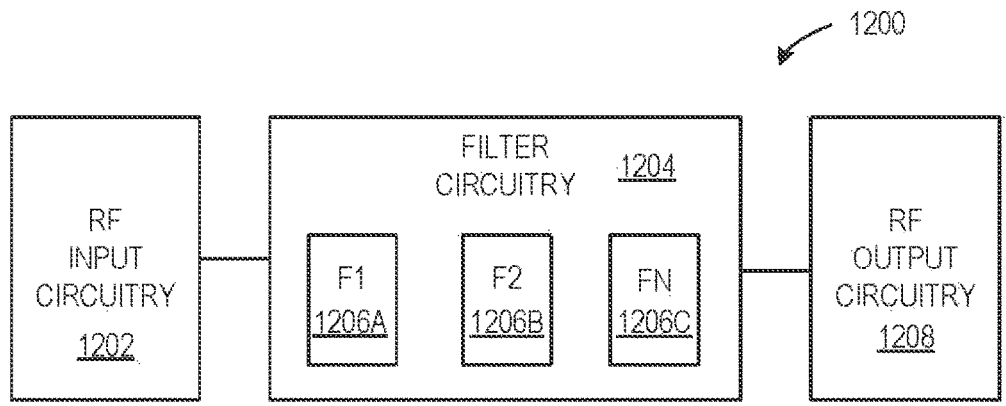
FIG. 12 illustrates a block diagram of an example system that can include one or more resonator-assisted LC filter circuits.

In certain embodiments, the resonator-assisted LC filter circuit can be connected to one or more additional filters, such as a bandpass filter and/or a lowpass filter (FIG. 12). Additionally or alternatively, as shown in FIG. 12, the resonator-assisted LC filter circuit may be connected between RF input circuitry and RF output circuitry.

Other embodiments are not limited to the order of the blocks shown in FIG. 11. The blocks may be performed in any order. For example, block 1106 may be performed before block 1100. Additionally or alternatively, some of the blocks can be performed in parallel. For example, blocks 1100, 1108, and 1110 may be performed in parallel. Additionally or alternatively, the number of inductor circuits, capacitor circuits, and/or resonator circuits may vary in other embodiments.

FIG. 12 illustrates a block diagram of an example system that can include one or more resonator-assisted LC filter circuits. The system 1200 includes RF input circuitry 1202 connected to filter circuitry 1204. In certain embodiments, the RF input circuitry 1202 includes a transceiver.

The filter circuitry 1204 includes one or more filters 1206A, 1206B, 1206C. In a non-limiting nonexclusive example, the one or more filters 1206A, 1206B, 1206C are a resonator-assisted LC filter circuit and a lowpass filter that may be connected in a cascaded arrangement. In another non-limiting nonexclusive example, the one or more filters 1206A, 1206B, 1206C are a bandpass filter and a resonator-assisted LC filter circuit. The bandpass filter and the resonator-assisted LC filter circuit can be connected in a cascaded arrangement. Alternatively, the one or more filters 1206A, 1206B, 1206C may be a resonator-assisted LC filter circuit, a lowpass filter, and a bandstop filter connected in a cascaded arrangement. The filter types that are included in the filter circuitry may be based at least in part on the rejection requirements of the system 1200.

The filter circuitry 1204 is connected to RF output circuitry 1208. In certain embodiments, the RF output circuitry 1008 includes an antenna. The RF input circuitry 1202 and/or the RF output circuitry 1208 may include additional or different components in other embodiments.

Figure 13:
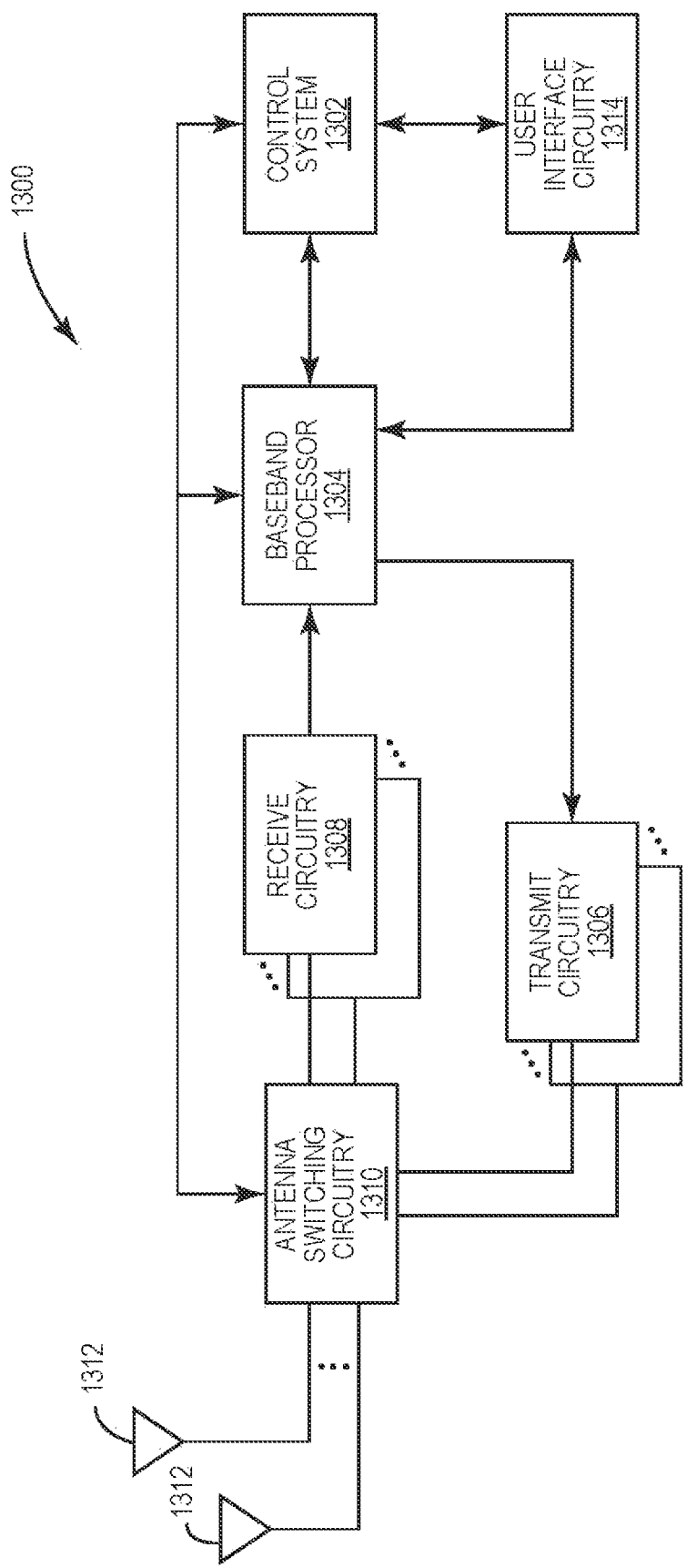
FIG. 13 illustrates a block diagram of example user elements that may include one or more resonator-assisted LC filter circuits in accordance with the embodiments.

FIG. 13 illustrates a block diagram of example user elements that may include one or more resonator-assisted LC filter circuits in accordance with the embodiments. The concepts described above may be implemented in various types of user elements 1300, such as mobile terminals, smart watches, tablets, computers, navigation devices, access points, and like wireless communication devices that support wireless communications, such as cellular, wireless local area network (WLAN), BLUETOOTH, and near field communications. The user elements 1300 will generally include a control system 1302, a baseband processor 1304, transmit circuitry 1306, receive circuitry 1308, antenna switching circuitry 1310, multiple antennas 1312, and user interface circuitry 1314. In a non-limiting example, the control system 1302 can be a field-programmable gate array (FPGA) or an application-specific integrated circuit (ASIC), as an example. In this regard, the control system 1302 can include at least a microprocessor(s), an embedded memory circuit(s), and a communication bus interface(s). The receive circuitry 1308 receives radio frequency signals via the antennas 1312 and through the antenna switching circuitry 1310 from one or more base stations. A low noise amplifier and a filter of the receive circuitry 1308 cooperate to amplify and remove broadband interference from the received signal for processing. Down conversion and digitization circuitry (not shown) will then down convert the filtered, received signal to an intermediate or baseband frequency signal, which is then digitized into one or more digital streams using analog-to-digital converter(s) (ADC).

The baseband processor 1304 processes the digitized received signal to extract the information or data bits conveyed in the received signal. This processing typically comprises demodulation, decoding, and error correction operations, as will be discussed on greater detail below. The baseband processor 1304 is generally implemented in one or more digital signal processors (DSPs) and application specific integrated circuits (ASICs).

For transmission, the baseband processor 1304 receives digitized data, which may represent voice, data, or control information, from the control system 1302, which it encodes for transmission. The encoded data is output to the transmit circuitry 1306, where a digital-to-analog converter(s) (DAC) converts the digitally encoded data into an analog signal and a modulator modulates the analog signal onto a carrier signal that is at a desired transmit frequency or frequencies. A power amplifier will amplify the modulated carrier signal to a level appropriate for transmission and deliver the modulated carrier signal to the antennas 1312 through the antenna switching circuitry 1310 to the antennas 1312. The multiple antennas 1312 and the replicated transmit and receive circuitries 1306, 1308 may provide spatial diversity. Modulation and processing details will be understood by those skilled in the art.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A filter circuit, comprising:
a first inductor circuit connected in series with a second inductor circuit, the first inductor circuit and the second inductor circuit connected between an input port and an output port of the filter circuit;
a first capacitor circuit connected in series with a second capacitor circuit, the first capacitor circuit and the second capacitor circuit connected in parallel with the first inductor circuit and the second inductor circuit between the input port and the output port of the filter circuit;
a third inductor circuit connected between a reference node and a first node between the first inductor circuit and the second inductor circuit;
a resonator circuit connected to a second node between the first capacitor circuit and the second capacitor circuit; and
a fourth inductor circuit connected between the resonator circuit and the reference node.

2. The filter circuit of claim 1, wherein:
the resonator circuit is a first resonator circuit; and
the filter circuit further comprises a second resonator circuit connected between the input port and the output port.

3. The filter circuit of claim 1, wherein the resonator circuit is a bulk acoustic wave resonator.

4. The filter circuit of claim 1, wherein the resonator circuit is a surface acoustic wave resonator.

5. The filter circuit of claim 1, wherein an inductance of the fourth inductor circuit is 0 nH.

6. A system, comprising:
radio-frequency (RF) input circuitry;
RF output circuitry; and
filter circuitry connected between the RF input circuitry and the RF output circuitry, wherein the filter circuitry comprises a filter circuit, the filter circuit comprising:
a first inductor circuit connected in series with a second inductor circuit, the first inductor circuit and the second inductor circuit connected between an input port and an output port of the filter circuit;
a first capacitor circuit connected in series with a second capacitor circuit, the first capacitor circuit and the second capacitor circuit connected in parallel with the first inductor circuit and the second inductor circuit between the input port and the output port of the filter circuit;
a third inductor circuit connected between a reference node and a first node between the first inductor circuit and the second inductor circuit;
a resonator circuit connected to a second node between the first capacitor circuit and the second capacitor circuit; and
a fourth inductor circuit connected between the resonator circuit and the reference node.

7. The system of claim 6, wherein the RF output circuitry comprises an antenna.

8. The system of claim 6, wherein the RF input circuitry comprises a transceiver.

9. The system of claim 6, wherein:
the resonator circuit is a first resonator circuit; and
the filter circuit further comprises a second resonator circuit connected between the input port and the output port.

10. The system of claim 6, wherein the resonator circuit is a bulk acoustic wave resonator.

11. The system of claim 6, wherein the resonator circuit is a surface acoustic wave resonator.

12. The system of claim 6, wherein the filter circuitry further comprises a lowpass filter connected to the filter circuit.

13. A method of providing a filter circuit, the method comprising:
providing a first inductor circuit connected in series with a second inductor circuit, the first inductor circuit and the second inductor circuit connected between an input port and an output port of the filter circuit;
providing a first capacitor circuit connected in series with a second capacitor circuit, the first capacitor circuit and the second capacitor circuit connected in parallel with the first inductor circuit and the second inductor circuit between the input port and the output port of the filter circuit;
providing a third inductor circuit connected between a reference node and a first node between the first inductor circuit and the second inductor circuit;
providing a resonator circuit connected to a second node between the first capacitor circuit and the second capacitor circuit; and
providing a fourth inductor circuit connected between the resonator circuit and the reference node.

14. The method of claim 13, wherein the resonator circuit is a surface acoustic wave resonator.

15. The method of claim 13, wherein:
the resonator circuit is a first resonator circuit; and
the method further comprises providing a second resonator circuit that is connected between the input port and the output port of the filter circuit.

16. The method of claim 13, wherein:
the filter circuit is included in filter circuitry; and
the method further comprises providing a lowpass filter connected to the resonator circuit in the filter circuitry.

17. The method of claim 16, further comprising:
providing radio-frequency (RF) input circuitry connected to the filter circuitry; and
providing RF output circuitry connected to the filter circuitry.

18. The method of claim 17, wherein the RF input circuitry comprises a transceiver.

19. The method of claim 17, wherein the RF output circuitry comprises an antenna.

20. The method of claim 13, wherein the resonator circuit is a bulk acoustic wave resonator.

* * * * *